(12) United States Patent
Koch

(10) Patent No.: US 7,012,434 B2
(45) Date of Patent: Mar. 14, 2006

(54) METHOD FOR DETERMINING THE AMOUNT OF CHARGE WHICH CAN BE DRAWN FROM A STORAGE BATTERY AND MONITORING DEVICE

(75) Inventor: Ingo Koch, Hameln (DE)

(73) Assignee: VB Autobatterie GmbH, Hannover (DE)

( * ) Notice: Subject to any disclaimer, the term of this patent is extended or adjusted under 35 U.S.C. 154(b) by 141 days.

(21) Appl. No.: 10/617,535

(22) Filed: Jul. 11, 2003

(65) Prior Publication Data

US 2004/0100267 A1    May 27, 2004

(30) Foreign Application Priority Data

Jul. 13, 2002  (DE) .............................. 102 31 700

(51) Int. Cl.
*G01R 31/36* (2006.01)

(52) U.S. Cl. .................. 324/427; 324/433; 320/132
(58) Field of Classification Search .............. 324/426, 324/427, 428, 431, 433; 320/132
See application file for complete search history.

(56) References Cited

U.S. PATENT DOCUMENTS

| | | | | |
|---|---|---|---|---|
| 3,906,329 A | * | 9/1975 | Bader ........................ | 320/134 |
| 4,153,867 A | | 5/1979 | Jungfer et al. ............. | 324/436 |
| 4,193,025 A | | 3/1980 | Frailing et al. ............. | 324/427 |
| 4,207,611 A | | 6/1980 | Gordon ...................... | 701/33 |
| 4,322,685 A | | 3/1982 | Frailing et al. ............. | 324/429 |
| 4,595,880 A | | 6/1986 | Patil ........................... | 324/427 |
| 4,642,600 A | | 2/1987 | Gummelt et al. .......... | 338/34 |
| 4,659,977 A | | 4/1987 | Kissel et al. ............... | 320/150 |
| 4,665,370 A | | 5/1987 | Holland ..................... | 324/429 |
| 4,719,427 A | | 1/1988 | Morishita et al. .......... | 324/427 |
| 4,816,736 A | | 3/1989 | Dougherty et al. ........ | 320/116 |
| 4,876,513 A | | 10/1989 | Brilmyer et al. ........... | 324/427 |
| 4,888,716 A | | 12/1989 | Ueno ......................... | 702/63 |
| 4,937,528 A | | 6/1990 | Palanisamy ................ | 324/430 |
| 4,943,777 A | | 7/1990 | Nakamura et al. ......... | 324/433 |
| 4,952,861 A | | 8/1990 | Horn .......................... | 320/133 |
| 5,002,840 A | | 3/1991 | Klebenow et al. ......... | 429/9 |
| 5,032,825 A | | 7/1991 | Kuznicki ................... | 340/636.15 |
| 5,055,656 A | | 10/1991 | Farah et al. ................ | 219/209 |
| 5,079,716 A | | 1/1992 | Lenhardt et al. ........... | 320/153 |

(Continued)

FOREIGN PATENT DOCUMENTS

DE    22 42 410    3/1973

(Continued)

OTHER PUBLICATIONS

Intelec '88—Tenth International communications Energy Conference, "A look at the Impedance of a Cell—S.L. DeBardelaben, New York Telephone Company," bearing a designation "Oct. 30-Nov. 2, 1988." (6 sheets).

(Continued)

*Primary Examiner*—Anjan Deb
(74) *Attorney, Agent, or Firm*—Foley & Lardner LLP

(57) ABSTRACT

A method for determining the amount of charge which can be drawn from a storage battery and a monitoring device are provided that measure at least one of battery currents and battery voltages at at least two points in time before or during a rise phase and during or after a decay phase of a charging or discharging operation. A characteristic variable for the amount of charge is determined. The characteristic variable is derived from the relationship of at least one battery voltage value from the rise phase with respect to at least one battery voltage value from the decay phase or from the relationship of at least one battery current value from the rise phase with respect to at least one battery current value from the decay phase.

25 Claims, 2 Drawing Sheets

U.S. PATENT DOCUMENTS

| | | | |
|---|---|---|---|
| 5,130,699 A | 7/1992 | Reher et al. | 340/661 |
| 5,159,272 A | 10/1992 | Rao et al. | 324/429 |
| 5,162,164 A | 11/1992 | Dougherty et al. | 429/9 |
| 5,204,610 A | 4/1993 | Pierson et al. | 320/126 |
| 5,223,351 A | 6/1993 | Wruck | 429/9 |
| 5,280,231 A | 1/1994 | Kato et al. | 322/28 |
| 5,281,919 A | 1/1994 | Palanisamy | 324/427 |
| 5,316,868 A | 5/1994 | Dougherty et al. | 429/9 |
| 5,321,627 A | 6/1994 | Reher | 702/63 |
| 5,352,968 A | 10/1994 | Reni et al. | 320/136 |
| 5,381,096 A | 1/1995 | Hirzel | 324/427 |
| 5,404,129 A | 4/1995 | Novak et al. | 340/428 |
| 5,412,323 A | 5/1995 | Kato et al. | 324/429 |
| 5,416,402 A | 5/1995 | Reher et al. | 340/636.16 |
| 5,428,560 A | 6/1995 | Leon et al. | 703/13 |
| 5,432,452 A * | 7/1995 | Fiorina et al. | 324/427 |
| 5,439,577 A | 8/1995 | Weres et al. | 204/268 |
| 5,488,283 A | 1/1996 | Dougherty et al. | 307/10.1 |
| 5,549,984 A | 8/1996 | Dougherty | 429/61 |
| 5,552,642 A | 9/1996 | Dougherty et al. | 307/10.3 |
| 5,563,496 A | 10/1996 | McClure | 320/128 |
| 5,572,136 A | 11/1996 | Champlin | 324/426 |
| 5,578,915 A | 11/1996 | Crouch, Jr. et al. | 324/428 |
| 5,656,915 A | 8/1997 | Eaves | 320/118 |
| 5,680,050 A | 10/1997 | Kawai et al. | 324/427 |
| 5,698,965 A | 12/1997 | York | 307/130 |
| 5,721,688 A | 2/1998 | Bramwell | 702/63 |
| 5,744,936 A | 4/1998 | Kawakami | 320/120 |
| 5,744,963 A | 4/1998 | Arai et al. | 324/427 |
| 5,761,072 A | 6/1998 | Bardsley, Jr. et al. | 702/63 |
| 5,773,977 A | 6/1998 | Dougherty | 324/429 |
| 5,808,367 A | 9/1998 | Akagi et al. | 290/40 C |
| 5,808,445 A | 9/1998 | Aylor et al. | 320/132 |
| 5,818,116 A | 10/1998 | Nakae et al. | 290/38 R |
| 5,818,333 A | 10/1998 | Yaffe et al. | 340/455 |
| 5,896,023 A | 4/1999 | Richter | 320/104 |
| 5,898,292 A | 4/1999 | Takemoto et al. | 320/136 |
| 5,936,383 A | 8/1999 | Ng et al. | 320/132 |
| 5,965,954 A | 10/1999 | Johnson et al. | 307/10.3 |
| 5,977,654 A | 11/1999 | Johnson et al. | 307/10.3 |
| 5,990,660 A | 11/1999 | Meissner | 320/137 |
| 6,016,047 A | 1/2000 | Notten et al. | 320/137 |
| 6,037,749 A | 3/2000 | Parsonage | 320/132 |
| 6,037,777 A | 3/2000 | Champlin | 324/430 |
| 6,057,666 A | 5/2000 | Dougherty et al. | 320/104 |
| 6,087,808 A | 7/2000 | Pritchard | 320/132 |
| 6,091,325 A | 7/2000 | Zur et al. | 340/455 |
| 6,118,252 A | 9/2000 | Richter | 320/132 |
| 6,118,275 A | 9/2000 | Yoon et al. | 324/427 |
| 6,144,185 A | 11/2000 | Dougherty et al. | 320/132 |
| 6,160,382 A | 12/2000 | Yoon et al. | 320/136 |
| 6,191,723 B1 * | 2/2001 | Lewis | 341/166 |
| 6,222,341 B1 | 4/2001 | Dougherty et al. | 320/104 |
| 6,268,712 B1 | 7/2001 | Laig-Horstebrock et al. | 320/132 |
| 6,271,642 B1 | 8/2001 | Dougherty et al. | 320/104 |
| 6,296,593 B1 | 10/2001 | Gotou et al. | 477/176 |
| 6,300,763 B1 | 10/2001 | Kwok | 324/427 |
| 6,304,059 B1 | 10/2001 | Chalasani et al. | 320/118 |
| 6,313,606 B1 * | 11/2001 | Eguchi | 320/132 |
| 6,331,762 B1 * | 12/2001 | Bertness | 320/134 |
| 6,369,578 B1 | 4/2002 | Crouch, Jr. et al. | 324/426 |
| 6,388,421 B1 | 5/2002 | Abe | 320/104 |
| 6,388,450 B1 | 5/2002 | Richter et al. | 324/427 |
| 6,392,389 B1 | 5/2002 | Kohler | 320/152 |
| 6,392,414 B1 | 5/2002 | Bertness | 324/429 |
| 6,392,415 B1 * | 5/2002 | Laig-Horstebrock et al. | 324/433 |
| 6,417,668 B1 | 7/2002 | Howard et al. | 324/426 |
| 6,424,157 B1 | 7/2002 | Gollomp et al. | 324/430 |
| 6,441,585 B1 | 8/2002 | Bertness | 320/132 |
| 6,445,158 B1 | 9/2002 | Bertness et al. | 320/104 |
| 6,452,361 B1 | 9/2002 | Dougherty et al. | 320/104 |
| 6,472,875 B1 * | 10/2002 | Meyer | 324/327 |
| 6,495,990 B1 | 12/2002 | Champlin | 320/132 |
| 6,507,194 B1 * | 1/2003 | Suzuki | 324/428 |
| 6,515,452 B1 | 2/2003 | Choo | 320/132 |
| 6,515,456 B1 | 2/2003 | Mixon | 320/160 |
| 6,522,148 B1 * | 2/2003 | Ochiai et al. | 324/428 |
| 6,534,992 B1 | 3/2003 | Meissner et al. | 324/426 |
| 6,556,019 B1 | 4/2003 | Bertness | 324/426 |
| 6,600,237 B1 | 7/2003 | Meissner | 307/34 |
| 6,600,293 B1 | 7/2003 | Kikuchi | 320/131 |
| 6,608,482 B1 * | 8/2003 | Sakai et al. | 324/426 |
| 6,653,818 B1 | 11/2003 | Laig-Horstebrock et al. | 320/132 |
| 6,924,622 B1 * | 8/2005 | Anbuky et al. | 320/132 |
| 2002/0008495 A1 | 1/2002 | Dougherty et al. | 320/104 |
| 2002/0026252 A1 | 2/2002 | Wruck et al. | 700/90 |
| 2002/0031700 A1 | 3/2002 | Wruck et al. | 429/61 |
| 2003/0047366 A1 | 3/2003 | Andrew et al. | 180/68.5 |
| 2003/0082440 A1 | 5/2003 | Mrotek et al. | 429/123 |
| 2003/0142228 A1 | 7/2003 | Flach et al. | 348/335 |
| 2003/0236656 A1 * | 12/2003 | Dougherty | 703/14 |
| 2004/0021468 A1 | 2/2004 | Dougherty et al. | 324/429 |

FOREIGN PATENT DOCUMENTS

| | | |
|---|---|---|
| DE | 2 242 510 C3 | 4/1974 |
| DE | 25 11 426 A1 | 9/1975 |
| DE | 33 34 128 A1 | 4/1985 |
| DE | 37 12 629 C2 | 10/1987 |
| DE | 38 08 559 A1 | 9/1989 |
| DE | 39 01 680 A1 | 3/1990 |
| DE | 40 07 883 A1 | 9/1991 |
| DE | 38 82 374 T2 | 10/1993 |
| DE | 44 14 134 A1 | 11/1994 |
| DE | 43 39 568 | 5/1995 |
| DE | 689 24 169 T2 | 3/1996 |
| DE | 195 40 827 A1 | 5/1996 |
| DE | 195 43 874 | 5/1996 |
| DE | 197 50 309 A1 | 5/1999 |
| DE | 691 31 276 T2 | 12/1999 |
| DE | 198 47 648 A1 | 4/2000 |
| DE | 694 23 918 T2 | 8/2000 |
| DE | 199 52 693 A1 | 5/2001 |
| DE | 199 60 761 C1 | 5/2001 |
| DE | 93 21 638 U1 | 8/2001 |
| DE | 100 21 161 A1 | 10/2001 |
| DE | 699 00 638 T2 | 8/2002 |
| EP | 0 516 336 B1 | 2/1992 |
| EP | 1 116 958 A2 | 7/2001 |
| EP | 1 120 641 A2 | 8/2001 |
| WO | WO 97/15839 | 5/1997 |
| WO | WO 99/17128 | 4/1999 |
| WO | WO 99 66340 | 12/1999 |
| WO | WO 00/04620 | 1/2000 |
| WO | WO 01 15023 | 3/2001 |
| WO | WO 03/001224 A1 | 1/2003 |

OTHER PUBLICATIONS

Battery Alert, Ltd., "The Easy-to-Install Battery Deterioration Warning Device", 12 Volt Model (BA101) Advertisement (2 sheets).

Journal of Applied Electrochemistry, vol. 10 No. 1, Jan. 1980—The Impedance of Electrical Storage Cells—N.A. Hampson, s.A.G.R. Karunathilaka, Department of Chemistry, R. Leek, Department of Electronic and Electrical Engineering, University of Technology, Loughborough, Liecestershire, UK (11 sheets).

Battery Evaluation Reports, s.e. Ross Laboratories, Inc., Apr. 1999 (1 page).

HSR-003 Application Notes, Hermetic Switch, Inc., Highway 92, Post Office Box 2220, Chickasha, OK 73023, http://www.hermeticswitch.com/RS_ frm.htm, available at least by Jan. 6, 2003 (1 page).

How It Works: Reed Switch Motor, http://members.tripod.com/simplemotor/rsmotor.htm, available at least by Jan. 6, 2003, 4 pages.

Reed Relay Technical & Applications Information, COTO Technology, 55 Dupont Drive, Providence, RI, pp. http://www.cotorelay.com/ReedTech.pdf, available at least by Jan. 6, 2003, 37-43.

Willibert Schleuter, *Das elektrische Ersatzschaltbild des Bleiakkumulators unter Berücksichtigung erzwungener Elektrolytströmung*, etz Archiv, vol. 4 (1982), Issue 7, pp. 213-218.

Lürkens et al., *Ladezustandsschätzuntt von Bleibatterien mit Hilfe des Kalman-Filters,* etz Archiv, vol. 8 (1986), Issue 7, pp. 231-236.

Brooke, L., "Resin Keeps Batteries Cool", A1 Inside Magazine, Nov., 1998, p. 55.

Hoover, J., "Failure Modes of Batteries Removed from Service", A Presentation at the 107th Convention of Battery Council International, Apr. 30-May. 3, 1995, p. 62.

Stan Gibilisco and Neil Sclater, Co-Editors-In-Chief, "Rectifier Bridge," Encyclopedia of Electronics, 2nd Edition, TAB Professional and Reference Books, 1996, pp. 708-711.

Lehman, A., "Electrical Battery Model For Leo Application Based on Absolute Instantaneous State of Charge," Proceedings of the European Space Power Conference held in Madrid, Spain, Oct. 2-6, 1989, ESA Publications, NL, vol. 1, pp. 173-178.

Robbins, Tim & Hawkins, John, "Battery Model For Over-Current Protection Simulation of DC Distribution Systems," Telecommunications Energy Conference, 1994, Intelec '94, 16th International Vancouver, BC, Canada Oct. 30-Nov. 3, 1994, New York, NY, IEEE, pp. 307-314 XP001036407 ISBN: 0-7803-2034-4.

Mayer, D. et al., "Modelling and Analysis of Lead Acid Battery Operation," Ecole des Mines de Paris, XP010092137, pp. 1-3.

Mauracher, P. & Karden, E., "Dynamic Modelling of Lead/Acid Batteries Using Impedance Spectroscopy for Parameter Identification," Journal of Power Sources, Elsevier Sequoia S.A., Lausanne, Ch., vol. 67 (1997) No. 1-2, pp. 69-84, XP004095174 ISSN: 0378-7753, p. 70, line 11; p. 82, line 5, figures 2, 3, 12.

Baert, D & Vervaet, A., "Lead-Acid Battery Model for the Derivation of Peukert's Law," Electrochimica Acta, Elsevier Science Publishers, Barking, GB, vol. 44, No. 20, pp. 3491-3504 XP004168624 ISSN: 0013-4686.

International Search Report for PCT/US02/19760 (international filing date Jun. 21, 2002), date of mailing Oct. 10, 2002.

Conference Proceedings, Intelec '86—International Telecommunications Energy Conference, Determining the End of Battery Life—Sheldon DeBardelaben, New York Telephone Company, bearing a designation "Oct. 19-22, 1986." (6 sheets).

Bosch and the New E-Class, Electronic Battery Management System, Focus on Electronics, Nov. 2002 (1 sheet).

Forecast Review, The Battery Man, Nov., 1996 p. 21.

OnGuard™ XT Battery State-of-Health Monitor, 2003 Midtronics, Inc. P/N 156-983A (2 sheets).

* cited by examiner

METHOD FOR DETERMINING THE AMOUNT OF CHARGE WHICH CAN BE DRAWN FROM A STORAGE BATTERY AND MONITORING DEVICE

CROSS-REFERENCE TO RELATED PATENT APPLICATIONS

Germany Priority Application DE 102 31 700.3-34, filed Jul. 13, 2002, including the specification, drawings, claims and abstract, is incorporated herein by reference in its entirety.

BACKGROUND OF THE INVENTION

The present invention relates to a method for determining the amount of charge which can be drawn from a storage battery by measuring battery current values and battery voltage values at least two points in time before or during a rise phase and during or after a decay phase of a charging or discharging operation. The invention also relates to a monitoring device for a storage battery with measuring means for measuring battery voltage values and battery current values and with evaluation means.

Numerous methods are known for determining and predicting the state of a storage battery by simple means during the operation of the storage battery.

For example, DE 199 50 424 A1 describes a method for determining the starting capability of a starter battery of a motor vehicle, in which the battery current and the battery voltage are determined shortly before and during loading of the starter battery by starting of the internal combustion engine. The internal resistance and the amount of charge drawn are calculated from the respective pairs of values of the battery current and the battery voltage. A measure of the availability of the starter battery during the starting operation is derived from the rate of rise of the internal resistance against the amount of charge drawn.

DE 37 12 629 C2 describes a measuring device for determining the remaining lifetime of a motor vehicle battery, which registers the battery voltage and the associated load current value before and after starting for the first time with the storage battery in the fully charged state. Moreover, the temperature-compensated internal resistance is determined and stored in a memory. This initial temperature-compensated internal resistance is compared with internal resistance values which are determined for later starting operations of the internal combustion engine by the motor vehicle battery. The indication of the expected lifetime of the storage battery takes place thereafter in dependence on given stored threshold values.

It is known from WO 99/17128 to compare during the starting operation the voltage values of neighboring voltage minima, which occur on account of the compression and decompression of the engine pistons of an internal combustion engine started with the aid of the storage battery. The difference between these values serves as a measure for an indication of the state of the battery.

DE 39 01 680 C2 describes a method for monitoring the cold starting capability of a starter battery of an internal combustion engine, in which the variation over time of the voltage drop across the connection terminals of the starter for the internal combustion engine during the starting operation is observed and evaluated.

DE 198 47 648 A1 discloses a method for determining the state of charge and the peak current loadability of storage batteries, in which the no-load voltage is determined, the true open-circuit voltages are determined, with the variation over time being taken into account in particular, the converted amount of current is determined and the acid capacity is determined. An indication as to the starting capability of the storage battery is derived from this.

WO 00/04620 describes a system and a method for observing the state of a storage battery which is installed in a vehicle. An internal battery resistance and a polarization resistance are calculated from the battery voltage and battery current values determined during the starting of the engine. In addition, a value for the state of charge SOC is determined. On the basis of these values and their rates of rise, the battery state is analyzed and an indication given as to whether the battery is still capable of starting the engine.

Although the methods and devices described above serve for determining the suitability of a storage battery with regard to the capability of starting an engine or ascertaining the state of charge of a new battery, they do not allow an indication to be given as to the amount of charge which can be drawn from the storage battery, in particular for small currents.

One issue with storage batteries is, however, that the amount of charge Q which can be drawn when a storage battery is fully charged can decrease due to various causes. Consequently, the same amount of charge as in the new state can no longer be drawn from a used storage battery. These causes may be, for example, in the case of lead-acid storage batteries, the loss of active mass due to sludge deposition, sulfation or the like.

If, for example, the state of charge of a storage battery is determined by measuring the open-circuit voltage, as is possible for example in the case of a lead-acid storage battery, this value does not allow any indication to be given as to which amount of charge can still be drawn from the storage battery if the latter is no longer in the new state. The reason for this is that, although the state of charge is in this case a measure of the amount of charge which can be drawn from the acid, the amount of charge which still can be drawn from the active mass only correlates with the amount of charge in the acid in the new state.

With a definition of the state of charge SOC as a quotient of the difference between the nominal amount of charge and the amount of charge drawn with respect to the nominal amount of charge $$SOC = \frac{(\text{nominal amount of charge} - \text{amount of charge drawn})}{\text{nominal amount of charge,}}$$

the state of charge SOC likewise does not provide a correct indication as to the amount of charge Q which can be drawn from the storage battery.

According to these definitions, the state of charge consequently does not provide any indication as to the amount of charge Q which can be drawn in the full state of charge. Since in many technical applications the state of charge SOC can only be determined by these methods, there is the need for a method which determines the amount of charge Q which can actually be drawn. There is also a need for a device (e.g., a monitoring device) for use with a storage battery that is capable of measuring battery voltage and current values.

SUMMARY

An exemplary embodiment relates to a method for determining the amount of charge which can be drawn from a storage battery by measuring at least one of battery currents and battery voltages at at least two points in time before or during a rise phase and during or after a decay phase of a charging or discharging operation. The method includes determining a characteristic variable for the amount of charge. The characteristic variable is derived from the relationship of at least one battery voltage value from the rise phase with respect to at least one battery voltage value from the decay phase or from the relationship of at least one battery current value from the rise phase with respect to at least one battery current value from the decay phase.

Another exemplary embodiment relates to a monitoring device for a storage battery. The monitoring device includes means for measuring battery voltage values and battery current values and evaluation means. The means for measuring measures at least one of battery currents and battery voltages at at least two points in time before or during a rise phase and during or after a decay phase of a charging or discharging operation. The evaluation means are configured to determine a characteristic variable for the amount of charge. The characteristic variable is derived from the relationship of at least one battery voltage value from the rise phase with respect to at least one battery voltage value from the decay phase or from the relationship of at least one battery current value from the rise phase with respect to at least one battery current value from the decay phase.

BRIEF DESCRIPTION OF THE DRAWINGS

The invention is explained in more detail below with reference to the accompanying drawings, in which.

DETAILED DESCRIPTION OF THE PREFERRED AND EXEMPLARY EMBODIMENTS

Figure 1:
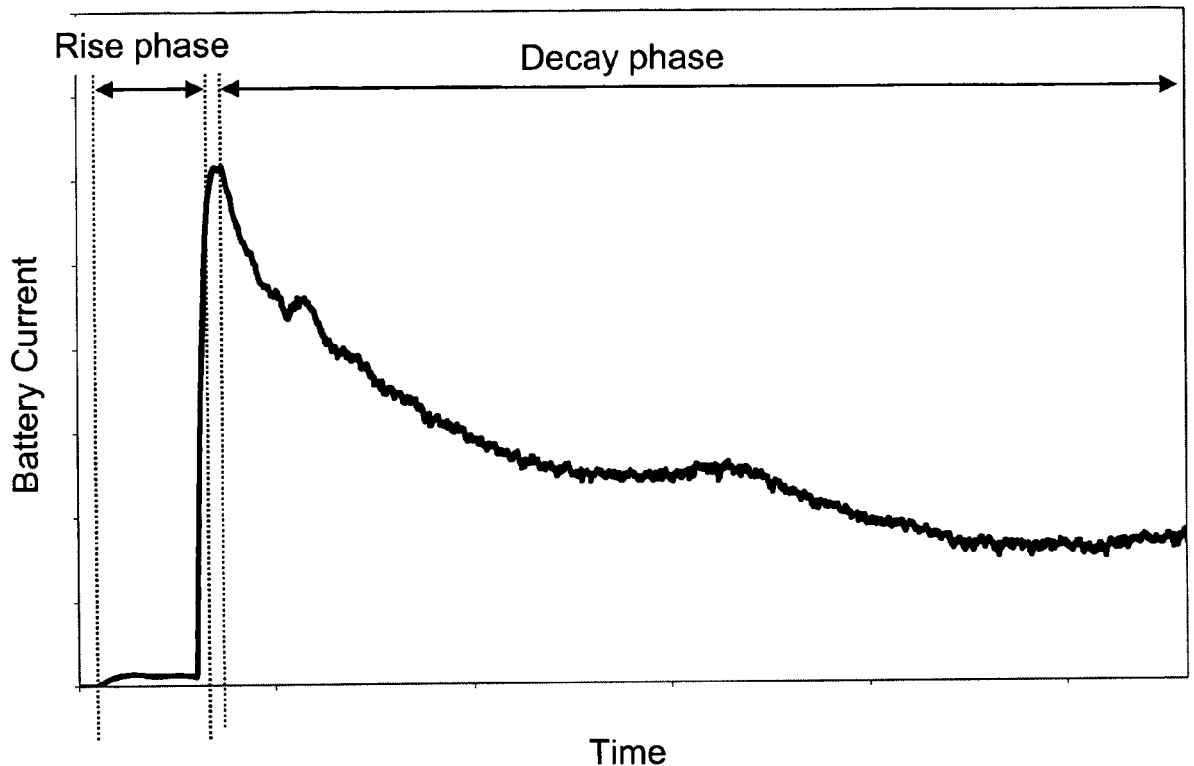
FIG. 1 shows a detail of a battery current profile for a typical start of an internal combustion engine with a storage battery.

The present invention provides a method for determining the amount of charge Q which can be drawn from a storage battery by measuring battery current values and battery voltage values at at least two points in time before or during a rise phase and during a decay phase of a charging or discharging operation, with which method a characteristic variable H for the amount of charge Q which can be drawn from a storage battery that is no longer in the new state can be determined by simple measurement.

Such determination is achieved with the method of the generic type according to the invention by determining a characteristic variable H for the amount of charge Q which can be drawn from the relationship of at least one battery voltage value from the rise phase with respect to at least one battery voltage value from the decay phase or from the relationship of at least one battery current value from the rise phase with respect to at least one battery current value from the decay phase.

It is therefore proposed to evaluate the behavior of the hysteresis which is obtained by plotting the battery current values and battery voltage values for preferably brief pulse-like loading in the charging or discharging direction, and to conclude from this the amount of charge Q which can be drawn from the storage battery.

For this purpose, the battery current values and battery voltage values are preferably determined simultaneously at at least two points in time. It has been found that the relationship of the battery current values for approximately the same battery voltage value and also the relationship of the battery voltage values for approximately the same battery current value is a measure of the amount of charge Q which can be drawn. The same battery voltage values or battery current values in the hysteresis curve are obtained through the behavior over time during the loading, in that at least a first measurement is carried out shortly before the loading or during the rise phase of the loading and a second measurement is carried out in the decay phase during the decay of the loading or shortly after the loading.

The relationship for determining the characteristic variable H may be, for example, the difference between two battery voltages determined at different points in time, the battery currents being approximately the same at the two points in time. The relationship may, however, also be the difference between two battery currents determined at different points in time for approximately identical battery voltages.

However, it has also been found that the characteristic variable H for the amount of charge Q which can still be drawn can be determined from the relationship of the ratio of the battery voltage determined at a first point in time before or during a rise phase of the loading with respect to the battery voltage determined at a second point in time after or during a decay phase of the loading. In turn, the battery currents should be approximately the same at the first and second points in time. Equally, the relationship may also be the ratio of the battery currents determined at a first point in time and second point in time, the battery voltages being approximately the same.

The hysteresis curve is evaluated in such a way that a numerical value is fixed for one of the measured variables (i.e., battery current or battery voltage), and the two associated pairs of values of the other measured variable, respectively (i.e., the battery voltage or battery current), are determined from the hysteresis curve and set in relation to one another.

In addition, it may be advisable for technical reasons to fix a numerical value for the battery current or the battery voltage separately in each case for the rise phase and the decay phase. The pairs of values of the other measured variable then obtained for different fixed numerical values can then be set in relation to one another in an analogous way. This procedure applies in particular in the case of a linear progression of the hysteresis curve.

The battery voltage values or battery current values during the rise phase and decay phase may also be set in relation to one another by evaluation of the hysteresis behavior. For this purpose, intelligent methods, such as neural networks and fuzzy techniques, may be used, for example, allowing an indication as to the amount of charge Q which can be drawn to be ascertained on the basis of specific points of the hysteresis curve. It is particularly advantageous to derive the characteristic variable H from parameters of an equivalent circuit or some other model which is adapted to the hysteresis curve.

For a storage battery used, for example, in a motor vehicle, it is advantageous if the chosen points in time lie in the starting phase of an internal combustion engine coupled to the storage battery.

It is also conceivable to set in relation to one another the battery voltage values which are obtained when the battery current is approximately zero at the chosen points in time.

For carrying out the method, a battery voltage value or a battery current value may be fixed and the associated other measured variable, that is to say of the battery current or of the battery voltage, determined by continuous monitoring when the fixed value of the battery voltage or of the battery current is reached.

As an alternative to this, continuous recording and storing of the battery current values and battery voltage values as hysteresis curves may also take place during loading. The stored hysteresis curves are evaluated later for the determination of the characteristic variable H. Since, under some circumstances, the measured values are sampled at time intervals, it is advantageous to perform an interpolation, extrapolation and/or regression of the determined battery voltage values and battery current values, in order to determine battery voltages for given battery currents or battery currents for given battery voltages with great accuracy. These methods may also be used, however, to compensate for possible measuring errors.

The predictive value for the amount of charge Q which can be drawn derived from the characteristic variable H can be improved by determination of the state of charge SOC of the storage battery and/or the battery temperature and the like, in that the characteristic value H is corrected by the determined additional factors, such as state of charge SOC, battery temperature, etc.

For this purpose, it is advantageous to learn and store families of characteristics HLern for characteristic values of a storage battery in the new state in dependence on the state of charge SOC and the battery temperatures. The amounts of charge Q which can be drawn are then determined from the determined characteristic variable $H_m$ for a momentary state of charge $SOC_m$ and a momentary battery temperature $TBat_m$ with a corresponding new-value characteristic variable $H_{new}$, which is determined from the family of characteristics HLern for the momentary state of charge $SOC_m$ and the momentary battery temperature $TBat_m$.

It is particularly advantageous to calculate a coefficient of measure J, for example as a difference between or ratio of the determined characteristic variable $H_m$ and the corresponding characteristic variable $H_{new}$ in the new state for the momentary state of charge $SOC_m$ and the momentary battery temperature $TBat_m$. The amount of charge Q which can be drawn is then determined with a family of characteristics for values of the amount of charge which can be drawn, values of the amount of charge which can be drawn being stored in the family of characteristics in dependence on the states of charge SOC, the battery temperature TBat and the coefficients of measure J.

According to the method mentioned above, the amount of charge Q which can be drawn generally cannot be determined with adequate accuracy in the case of extremely short and low loads and long-term loads. The time period between the points in time of the battery voltage values or battery current values set in relation should therefore be above a defined minimum time period and be below a defined maximum time period, that is to say, should lie within a defined time window.

A monitoring device of the generic type including evaluation means may be provided or designed for carrying out the method described above.

FIG. 1 reveals a detail of a battery current profile for a typical start of an internal combustion engine. It is clear that the battery current achieves a current maximum in a relatively short time period. Subsequently, the battery current slowly decays. The time period until the current maximum is reached is defined as the rise phase An and the time period after the current maximum is defined as the decay phase Ab.

Against this background, the invention is based on the realization that the amount of charge Q which can be drawn can be determined from a characteristic variable H, which is defined as the relationship of battery voltage values $U_{An}$ or battery current values $I_{An}$ in the rise phase An with respect to the corresponding values $U_{Ab}$, $I_{Ab}$ in the decay phase Ab.

Figure 2:
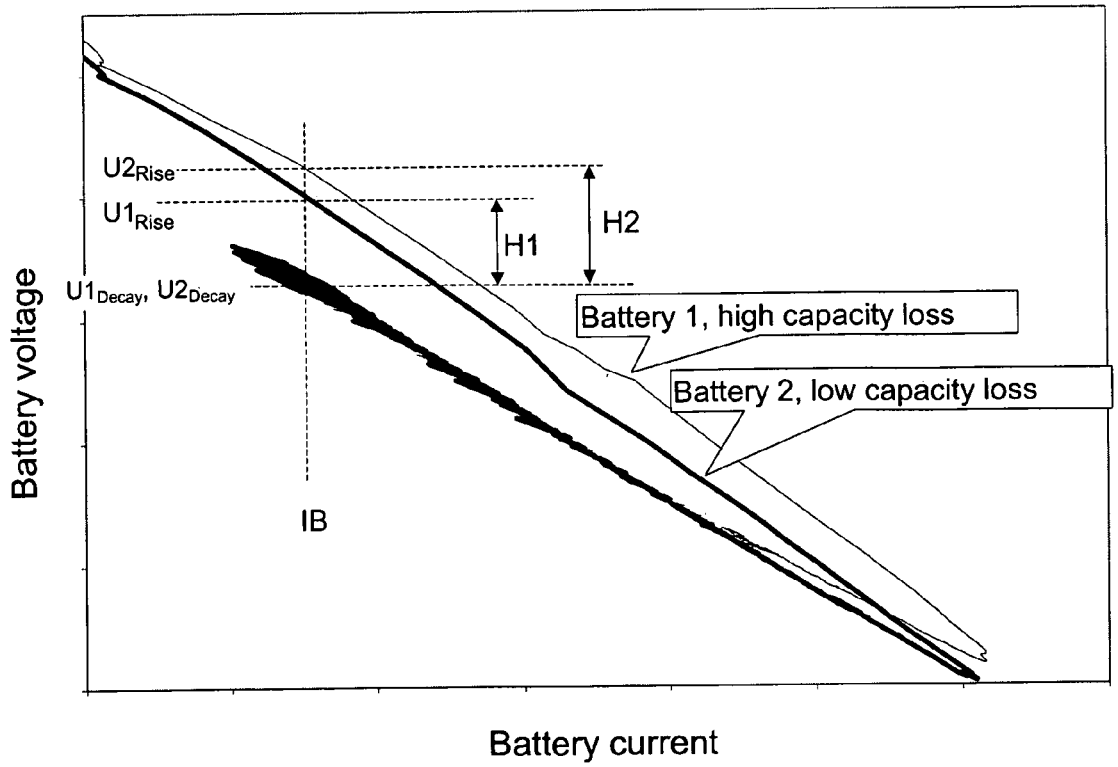
FIG. 2 shows a hysteresis curve with a battery voltage plotted against the battery current for two different [sic] aged storage batteries of the same type.

FIG. 2 shows a hysteresis curve for two typical, randomly chosen and differently aged storage batteries of the same type with an identical state of charge SOC for an identical battery temperature TBat. The hysteresis curve is consequently defined as the battery voltage UB plotted against the battery current IB. The two selected storage batteries exhibit amounts of charge Q which can be drawn differently.

For the determination of the amounts of charge Q, the battery voltage $U_{Ab}$ is determined for a fixed battery current IB in the rise phase An and decay phase Ab and the two battery voltages $U_{An}$ and $U_{Ab}$ are set in a relationship. This produces the smaller characteristic variable H1 for the first storage battery with a small loss of capacity and the greater characteristic variable H2 for the second storage battery with a large loss of capacity.

It is immediately clear from the hysteresis curve that the characteristic variable H can be determined, for example, from the difference between the battery voltage $U_{An}$ in the rise phase An and the battery voltage $U_{Ab}$ in the decay phase Ab. Equally, however, the ratio between the battery voltage $U_{An}$ in the rise phase An with respect to the battery voltage $U_{Ab}$ in the decay phase Ab can also be calculated.

It is also clear from the comparison of the hysteresis curves that the voltage dip, and consequently the internal resistance, is not a measure of the amount of charge Q which can still be drawn from the storage battery. Although the storage battery 1 has suffered a smaller loss of capacity, it shows a greater maximum voltage dip than the storage battery 2 with the larger loss of capacity.

Rather, it is proposed in the case of the method according to the invention to determine the characteristic variable H for example by the formulas $$H=U_{An}-U_{Ab} \text{ or } H=U_{An}:U_{Ab},$$

where the battery current value IB is fixed. The battery voltage values $U_{An}$ and $U_{Ab}$ in the rise phase An and decay phase Ab are the corresponding values of the hysteresis curve for the fixed current value IB.

According to an alternative embodiment of the method, the characteristic variable H can also be determined from the relationship of two battery current values $I_{An}$, $I_{Ab}$ for an identical battery voltage UB.

In the event that no associated voltage values were determined for the fixed current value IB or no associated current values were determined for the fixed voltage value UB, the battery voltage and battery current values can also be determined by interpolation, extrapolation or regression. These methods may also be used, however, to eliminate measurement inaccuracies if measured values exist for the fixed battery current value IB or battery voltage value UB.

Figure 3:
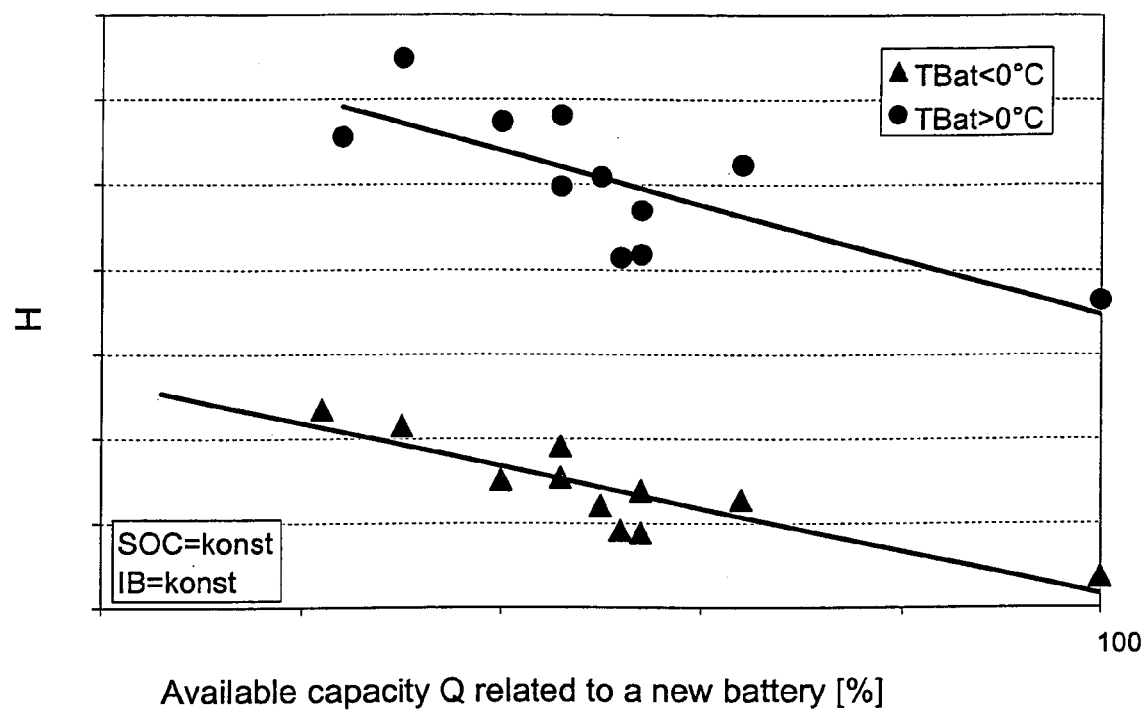
FIG. 3 shows a diagram for the determination of the available amount of charge from the characteristic variable H for different battery temperatures.

FIG. 3 shows a diagram illustrating the dependence of the available amount of charge Q on battery temperature, in one case the battery temperature TBat being less than 0° C. (triangles) and in the other case the battery temperature TBat being greater than 0° C. (circles). The state of charge SOC and the battery current value IB for the determination of the characteristic variable H are constant here. Each point represents a specific battery with different aging in each case.

Figure 4:
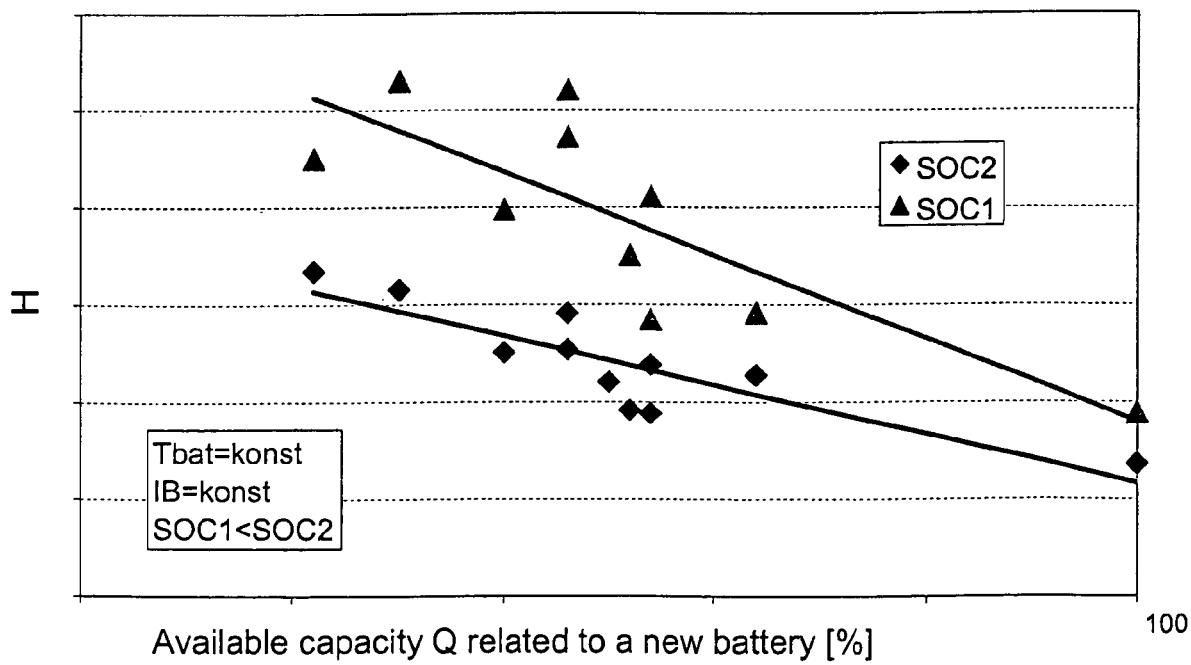
FIG. 4 shows a diagram for the determination of the available amount of charge from the characteristic variable H for different states of charge SOC.

Similarly, FIG. 4 shows a diagram from which the dependence between the characteristic variable H and the amount of charge Q which can be drawn is evident for two different amounts of charge SOC1 and SOC2, the battery temperature TBat and the battery current IB for the determination of the characteristic variable H being constant. The state of charge SOC1 is in this case less than the state of charge SOC2 (SOC1 less than SOC2).

It is clear that a unique, and in this case even linear, relationship exists between the characteristic variable H and the amount of charge Q which can be drawn, with respect to the new state. On the basis of this relationship, it is possible that the amount of charge Q which can be drawn can be determined directly based on the characteristic variable H.

In this case, a correction of the characteristic value H is advantageously performed by the state of charge SOC and/or the battery temperature TBat. This correction may be performed for example by empirical or mathematical recording of families of characteristics or mathematical functions. These methods may also be used, however, to eliminate measurement inaccuracies, for example, if measurement results are determined by simulation calculations. Also, the methods may be used, if measurement results are determined.

The characteristic variable H can also be advantageously learned by intelligent signal processing in dependence on the state of charge SOC and the battery temperature TBat for a storage battery in the new state. In the learning process, a family of characteristics HLern is then produced, for example, in dependence on the state of charge SOC and the battery temperature TBat. When the storage battery is no longer in the new state, a determined characteristic variable $H_m$ for a state of charge $SOC_m$ and any desired battery temperature $TBat_m$ is later compared with the learned characteristic value $H_{new}$ in the new state, which is determined on the basis of the state of charge $SOC_m$ and the battery temperature $TBat_m$, for example from the learned family of characteristics HLern. The result of this comparison is a coefficient of measure J, which may be, for example, the difference between or the ratio of $H_m$ and $H_{new}$ $$J=H_m-H_{new} \text{ or } J=H_m:H_{new}.$$

This coefficient of measure J together with the values of the state of charge $SOC_m$ and the battery temperature $TBat_m$ and, for example, a family of characteristics for characteristic variables Q in dependence on the state of charge SOC, the battery temperature TBat and the coefficient of measure J then produces the amount of charge Q which can be drawn from the storage battery.

It is important to note that the construction and arrangement of the elements of the energy store as shown and described in the preferred and other exemplary embodiments is illustrative only. Although only a few embodiments of the present inventions have been described in detail in this disclosure, those skilled in the art who review this disclosure will readily appreciate that many modifications are possible without materially departing from the novel teachings and advantages of the subject matter recited herein. It should be noted that the elements and/or assemblies of the system may be constructed from any of a wide variety of materials that provide sufficient strength or durability. Other substitutions, modifications, changes and omissions may be made in the design, operating conditions and arrangement of the preferred and other exemplary embodiments without departing from the scope of the present invention.

What is claimed is:

1. A method for determining the amount of charge which can be drawn from a storage battery by measuring at least one of battery currents and battery voltages at at least two points in time before or during a rise phase and during or after a decay phase of a charging or discharging operation, the method comprising:

determining a characteristic variable for the amount of charge, the characteristic variable being derived from the relationship of at least one battery voltage value from the rise phase with respect to at least one battery voltage value from the decay phase or from the relationship of at least one battery current value from the rise phase with respect to at least one battery current value from the decay phase.

2. The method of claim 1 wherein the step of determining the characteristic variable comprises deriving the characteristic variable from the relationship of two battery voltage values which were respectively determined in the rise phase and decay phase for a fixed numerical value for the battery current.

3. The method of claim 1 wherein the step of determining the characteristic variable comprises deriving the characteristic variable from the relationship of two battery current values which were respectively determined in the rise phase and decay phase for a fixed battery voltage.

4. The method of claim 1 wherein the step of determining the characteristic variable comprises deriving the characteristic variable from the relationship of two battery voltage values which were respectively determined in the rise phase and decay phase for approximately identical battery current.

5. The method of claim 4 wherein the relationship is the difference between two battery voltages determined at different points in time, the battery currents being approximately identical at the two points in time.

6. The method of claim 1 wherein the step of determining the characteristic variable comprises deriving the characteristic variable from the relationship of two battery current values which were respectively determined in the rise phase and the decay phase for an approximately identical battery voltage.

7. The method of claim 6 wherein the relationship is the difference between two battery currents determined at different points in time, the battery voltages being approximately identical at the two points in time.

8. The method of claim 1 wherein the relationship used to derive the characteristic variable is the ratio of a battery voltage determined at a first point in time before or during the rise phase of the loading with respect to a battery voltage determined at a second point in time after or during the decay phase, wherein the storage battery has a current that is approximately the same at the first and second points in time.

9. The method of claim 1 wherein the relationship use to derive the characteristic variable is the ratio of a battery current determined at a first point in time before or during the rise phase with respect to a battery current determined at a second point in time after or during the decay phase, wherein the storage battery has a voltage that is approximately the same at the first and second points in time.

10. The method of claim 1 wherein the at least one of the two points in time lie in the phase of starting an internal combustion engine coupled to the storage battery.

11. The method of claim 1 wherein the storage battery has a current that is approximately zero at at least one of the two points in time.

12. The method of claim 1 further comprising continuously recording and storing of battery current values and battery voltage values as hysteresis curves during loading.

13. The method of claim 12 further comprising evaluating the stored hysteresis curves for the determination of the characteristic variable.

14. The method of claim 1 further comprising at least one of interpolating and extrapolating battery voltage values and battery current values to determine battery voltages for given battery currents or for the determination of battery currents for given battery voltages.

15. The method of claim 1 further comprising determining at least one of a state of charge of the storage battery and a battery temperature of the storage battery.

16. The method of claim 15 further comprising correcting the characteristic variable utilizing at least one of the state of charge of the storage battery and the battery temperature of the storage battery.

17. The method of claim 15 further comprising learning and storing families of characteristics for characteristic variables of a storage battery in a new state in dependence on the state of charge and the battery temperatures.

18. The method of claim 17 further comprising determining the amount of charge which can be derived from the characteristic variables for a momentary state of charge and a momentary battery temperature with a corresponding nominal value characteristic variable which is determined from the family of characteristics for the momentary state of charge and the momentary battery temperature.

19. The method of claim 15 further comprising calculating a coefficient of measure as a difference between or ratio of the determined characteristic variable and the corresponding characteristic variable in the new state for the momentary state of charge and the momentary battery temperature.

20. The method of claim 19 further comprising determining the amount of charge which can be drawn with a family of characteristics for values of the amount of charge which can be drawn, which are stored in the family of characteristics in dependence on states of charge, battery temperature, and coefficients of measure.

21. The method of claim 1 further comprising correcting the characteristic variable utilizing a charge capacity drawn from the storage battery over a defined time period.

22. The method of claim 1 wherein the determination of the characteristic variable takes place when the time period between the two points in time is above a defined minimum time period and below a defined maximum time period.

23. The method of claim 1 further comprising comparing the characteristic variable with given families of characteristics for amounts of charge which can be drawn in dependence on the states of charge, battery temperatures and characteristic variables.

24. The method of claim 1 further comprising determining the characteristic variable from parameters of an equivalent circuit or model, the parameters being determined by adaptation of the equivalent circuit or model to at least one of the battery current values and battery voltage values in the rise phase and decay phase.

25. A monitoring device for a storage battery comprising:
means for measuring battery voltage values and battery current values; and
evaluation means;
wherein the means for measuring measures at least one of battery currents and battery voltages at at least two points in time before or during a rise phase and during or after a decay phase of a charging or discharging operation; and
wherein the evaluation means are configured to determine a characteristic variable for the amount of charge, the characteristic variable being derived from the relationship of at least one battery voltage value from the rise phase with respect to at least one battery voltage value from the decay phase or from the relationship of at least one battery current value from the rise phase with respect to at least one battery current value from the decay phase.

* * * * *

UNITED STATES PATENT AND TRADEMARK OFFICE
CERTIFICATE OF CORRECTION

PATENT NO. : 7,012,434 B2
DATED : March 14, 2006
INVENTOR(S) : Ingo Koch

It is certified that error appears in the above-identified patent and that said Letters Patent is hereby corrected as shown below:

<u>Column 8,</u>
Line 61, replace "use" with -- used --.

Signed and Sealed this

Thirtieth Day of May, 2006

JON W. DUDAS
*Director of the United States Patent and Trademark Office*